US010630052B2

(12) United States Patent
Bazzani et al.

(10) Patent No.: US 10,630,052 B2
(45) Date of Patent: Apr. 21, 2020

(54) EFFICIENCY IMPROVED DRIVER FOR LASER DIODE IN OPTICAL COMMUNICATION

(71) Applicant: MACOM Technology Solutions Holdings, Inc., Lowell, MA (US)

(72) Inventors: Cristiano Bazzani, Irvine, CA (US); Chi Mo, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 16/152,171

(22) Filed: Oct. 4, 2018

(65) Prior Publication Data

US 2019/0103726 A1    Apr. 4, 2019

Related U.S. Application Data

(63) Continuation of application No. PCT/US2018/054257, filed on Oct. 3, 2018.
(Continued)

(51) Int. Cl.
*H01S 5/042* (2006.01)
*H02M 3/158* (2006.01)
(Continued)

(52) U.S. Cl.
CPC ............ *H01S 5/0428* (2013.01); *H02M 1/08* (2013.01); *H02M 3/156* (2013.01); *H02M 3/158* (2013.01);
(Continued)

(58) Field of Classification Search
CPC .... H01S 5/0428; H01S 5/06226; H02M 1/08; H02M 3/156; H02M 3/158; H02M 2001/0025; H03K 4/08
See application file for complete search history.

(56) References Cited

U.S. PATENT DOCUMENTS 4,488,305 A    12/1984    Claverie
4,534,064 A    8/1985    Giacometti et al.
(Continued)

FOREIGN PATENT DOCUMENTS

EP    0606161    4/2000
EP    1471671    12/2004
(Continued)

OTHER PUBLICATIONS

Abhijit Phanse, National Semiconductor, "Exercise 2: Define the time variance of a fiber optic channel's Impulse Response, and suggest a method for measuring it", IEEE 802.3ae, Nov. 2000, 13 pages.
(Continued)

*Primary Examiner* — Xinning (Tom) Niu
(74) *Attorney, Agent, or Firm* — Weide & Miller, Ltd.

(57) ABSTRACT

A circuit and method provide a headroom voltage for a laser driver driving a laser diode such that the laser diode provides signals to an optical communications device. The circuit includes a headroom control circuit receiving the headroom voltage from the laser driver, the headroom control circuit generating a controlled voltage based on the headroom voltage, and a DC-DC converter receiving the controlled voltage from the headroom control circuit generating a voltage Vout based on the controlled voltage, and applying the voltage Vout as an input to the laser diode. The headroom control circuit and the DC-DC converter are connected in a feedback loop with the laser diode to continuously provide the voltage Vout to the laser diode, and the DC-DC converter modifies the voltage Vout to compensate for burn-in characteristics or temperature drift of the laser diode over time to maintain an optimized headroom voltage for the laser driver.

20 Claims, 6 Drawing Sheets

Related U.S. Application Data

(60) Provisional application No. 62/568,248, filed on Oct. 4, 2017.

(51) Int. Cl.
  *H02M 3/156* (2006.01)
  *H02M 1/08* (2006.01)
  *H03K 4/08* (2006.01)
  *H02M 1/00* (2006.01)
  *H01S 5/062* (2006.01)

(52) U.S. Cl.
  CPC . *H01S 5/06226* (2013.01); *H02M 2001/0025* (2013.01); *H03K 4/08* (2013.01)

(56) References Cited

U.S. PATENT DOCUMENTS

| | | |
|---|---|---|
| 4,545,078 A | 10/1985 | Wiedeburg |
| 4,687,937 A | 8/1987 | Aagano et al. |
| 4,709,416 A | 11/1987 | Patterson |
| 4,734,914 A | 3/1988 | Yoshikawa |
| 4,747,091 A | 5/1988 | Doi |
| 4,864,649 A | 9/1989 | Tajima et al. |
| 5,019,769 A | 5/1991 | Levinson |
| 5,039,194 A | 8/1991 | Block et al. |
| 5,057,932 A | 10/1991 | Lang |
| 5,334,826 A | 8/1994 | Sato et al. |
| 5,383,046 A | 1/1995 | Tomofuji et al. |
| 5,383,208 A | 1/1995 | Queniat et al. |
| 5,392,273 A | 2/1995 | Masaki et al. |
| 5,394,416 A | 2/1995 | Ries |
| 5,396,059 A | 3/1995 | Yeates |
| 5,448,629 A | 9/1995 | Bosch et al. |
| 5,471,501 A | 11/1995 | Parr et al. |
| 5,488,627 A | 1/1996 | Hardin et al. |
| 5,491,548 A | 2/1996 | Bell et al. |
| 5,510,924 A | 4/1996 | Terui et al. |
| 5,532,471 A | 7/1996 | Khorramabadi et al. |
| 5,557,437 A | 9/1996 | Sakai et al. |
| 5,574,435 A | 11/1996 | Mochizuki et al. |
| 5,594,748 A | 1/1997 | Jabr |
| 5,636,254 A | 6/1997 | Hase et al. |
| 5,673,282 A | 9/1997 | Wurst |
| 5,710,660 A | 1/1998 | Yamamoto et al. |
| 5,812,572 A | 9/1998 | King et al. |
| 5,822,099 A | 10/1998 | Takamatsu |
| 5,831,959 A | 11/1998 | Sakanushi |
| 5,844,928 A | 12/1998 | Shastri et al. |
| 5,892,220 A | 4/1999 | Woodward |
| 5,900,959 A | 5/1999 | Noda et al. |
| 5,912,694 A | 6/1999 | Miyake |
| 5,926,303 A | 7/1999 | Giebel et al. |
| 5,943,152 A | 8/1999 | Mizrahi et al. |
| 5,953,690 A | 9/1999 | Lemon et al. |
| 5,956,168 A | 9/1999 | Levinson et al. |
| 5,978,393 A | 11/1999 | Feldman et al. |
| 6,005,240 A | 12/1999 | Krishnamoorthy |
| 6,010,538 A | 1/2000 | Sun et al. |
| 6,014,241 A | 1/2000 | Winter et al. |
| 6,020,593 A | 2/2000 | Chow et al. |
| 6,021,947 A | 2/2000 | Swartz |
| 6,023,147 A | 2/2000 | Cargin, Jr. et al. |
| 6,049,413 A | 4/2000 | Taylor et al. |
| 6,064,501 A | 5/2000 | Roberts et al. |
| 6,081,362 A | 6/2000 | Hatakeyama et al. |
| 6,108,113 A | 8/2000 | Fee |
| 6,111,687 A | 8/2000 | Tammela |
| 6,115,113 A | 9/2000 | Flockencier |
| H1881 H | 10/2000 | Davis et al. |
| 6,160,647 A | 12/2000 | Gilliland et al. |
| 6,175,434 B1 | 1/2001 | Feng |
| 6,259,293 B1 | 7/2001 | Hayase et al. |
| 6,262,781 B1 | 7/2001 | Deter |
| 6,282,017 B1 | 8/2001 | Kinoshita |
| 6,292,497 B1 | 9/2001 | Nakano |
| 6,333,895 B1 | 12/2001 | Hamamoto et al. |
| 6,366,373 B1 | 4/2002 | MacKinnon et al. |
| 6,397,090 B1 | 5/2002 | Cho |
| 6,423,963 B1 | 7/2002 | Wu |
| 6,452,719 B2 | 9/2002 | Kinoshita |
| 6,473,224 B2 | 10/2002 | Dugan et al. |
| 6,494,370 B1 | 12/2002 | Sanchez |
| 6,504,857 B1 | 1/2003 | Iwazaki |
| 6,512,617 B1 | 1/2003 | Tanji et al. |
| 6,535,187 B1 | 3/2003 | Wood |
| 6,556,601 B2 | 4/2003 | Nagata |
| 6,563,848 B1 | 5/2003 | Iwazaki |
| 6,570,944 B2 | 5/2003 | Best et al. |
| 6,580,328 B2 | 6/2003 | Tan et al. |
| 6,597,485 B1 | 7/2003 | Ikeuchi |
| 6,657,488 B1 | 12/2003 | King et al. |
| 6,661,940 B2 | 12/2003 | Kim |
| 6,704,008 B2 | 3/2004 | Naito et al. |
| 6,707,600 B1 | 3/2004 | Dijaili et al. |
| 6,720,826 B2 | 4/2004 | Yoon |
| 6,740,864 B1 | 5/2004 | Dries |
| 6,801,555 B1 | 10/2004 | Dijaili et al. |
| 6,828,857 B2 | 12/2004 | Paillet et al. |
| 6,836,493 B2 | 12/2004 | Mahowald et al. |
| 6,837,625 B2 | 1/2005 | Schott et al. |
| 6,852,966 B1 | 2/2005 | Douma et al. |
| 6,862,047 B2 | 3/2005 | Hibi |
| 6,864,751 B1 | 3/2005 | Schmidt et al. |
| 6,868,104 B2 | 3/2005 | Stewart et al. |
| 6,879,217 B2 | 4/2005 | Visocchi |
| 6,888,123 B2 | 5/2005 | Douma et al. |
| 6,909,731 B2 | 6/2005 | Lu |
| 6,934,307 B2 | 8/2005 | DeCusatis et al. |
| 6,934,479 B2 | 8/2005 | Sakamoto et al. |
| 6,941,077 B2 | 9/2005 | Aronson et al. |
| 6,952,531 B2 | 10/2005 | Aronson et al. |
| 6,956,643 B2 | 10/2005 | Farr et al. |
| 6,957,021 B2 | 10/2005 | Aronson et al. |
| 6,967,320 B2 | 11/2005 | Chieng et al. |
| 7,005,901 B1 | 2/2006 | Jiang et al. |
| 7,031,574 B2 | 4/2006 | Huang et al. |
| 7,039,082 B2 | 5/2006 | Stewart et al. |
| 7,046,721 B2 | 5/2006 | Grohn |
| 7,049,759 B2 | 5/2006 | Roach |
| 7,050,720 B2 | 5/2006 | Aronson et al. |
| 7,058,310 B2 | 6/2006 | Aronson et al. |
| 7,065,114 B2 | 6/2006 | Hishiyama |
| 7,066,746 B1 | 6/2006 | Togami et al. |
| 7,079,775 B2 | 7/2006 | Aronson et al. |
| 7,106,769 B2 * | 9/2006 | Fairgrieve ............... H01S 5/042 372/38.04 |
| 7,127,391 B2 | 10/2006 | Chang et al. |
| 7,181,100 B2 | 2/2007 | Douma et al. |
| 7,184,671 B2 | 2/2007 | Wang |
| 7,193,957 B2 | 3/2007 | Masui et al. |
| 7,206,023 B2 | 4/2007 | Belliveau |
| 7,215,891 B1 | 5/2007 | Chiang et al. |
| 7,233,206 B2 | 6/2007 | Murakami et al. |
| 7,265,334 B2 | 9/2007 | Draper et al. |
| 7,276,682 B2 | 10/2007 | Draper et al. |
| 7,357,513 B2 | 4/2008 | Watson et al. |
| 7,381,935 B2 | 6/2008 | Sada et al. |
| 7,400,662 B2 | 7/2008 | Robinson |
| 7,403,064 B2 | 7/2008 | Chou et al. |
| 7,453,475 B2 | 11/2008 | Nitta et al. |
| 7,502,400 B2 | 3/2009 | Preisach |
| 7,504,610 B2 | 3/2009 | Draper |
| 7,741,908 B2 | 6/2010 | Furuta |
| 7,778,294 B2 | 8/2010 | Nishimura et al. |
| 8,094,692 B2 | 1/2012 | Nakamura |
| 8,548,336 B2 | 10/2013 | Nuttgens |
| 8,571,079 B1 | 10/2013 | Nguyen |
| 8,872,487 B2 * | 10/2014 | Belloni ............... H05B 33/0815 323/259 |
| 9,419,410 B2 | 8/2016 | Usuki |
| 2001/0046243 A | 1/2001 | Schie |
| 2002/0015305 A1 | 2/2002 | Bornhorst et al. |
| 2002/0064193 A1 | 5/2002 | Diaz |

(56) References Cited

U.S. PATENT DOCUMENTS

| | | |
|---|---|---|
| 2002/0085600 A1 | 7/2002 | Jung |
| 2002/0105982 A1 | 8/2002 | Chin et al. |
| 2002/0130977 A1 | 9/2002 | Hibi |
| 2002/0140378 A1 | 10/2002 | Volk et al. |
| 2002/0181533 A1 | 12/2002 | Vail |
| 2003/0030756 A1 | 2/2003 | Kane et al. |
| 2003/0043869 A1 | 3/2003 | Vaughan |
| 2003/0053003 A1 | 3/2003 | Nishi et al. |
| 2003/0067662 A1 | 4/2003 | Brewer et al. |
| 2003/0122057 A1 | 7/2003 | Han et al. |
| 2004/0032890 A1 | 2/2004 | Murata |
| 2004/0047635 A1 | 3/2004 | Aronson et al. |
| 2004/0095976 A1 | 5/2004 | Bowler et al. |
| 2004/0114650 A1 | 6/2004 | Tanaka |
| 2004/0136727 A1 | 7/2004 | Androni et al. |
| 2004/0160996 A1 | 8/2004 | Giorgi |
| 2004/0202215 A1 | 10/2004 | Fairgrieve |
| 2004/0240041 A1 | 12/2004 | Tian et al. |
| 2004/0258115 A1 | 12/2004 | Murata |
| 2005/0024142 A1 | 2/2005 | Sowlati |
| 2005/0062530 A1 | 3/2005 | Bardsley et al. |
| 2005/0105574 A1 | 5/2005 | Wu |
| 2005/0141576 A1 | 6/2005 | Ikeda |
| 2005/0168319 A1 | 8/2005 | Bhattacharya et al. |
| 2005/0180280 A1 | 8/2005 | Hoshino et al. |
| 2005/0185149 A1 | 8/2005 | Lurkens et al. |
| 2005/0215090 A1 | 9/2005 | Harwood |
| 2005/0243879 A1 | 11/2005 | Horiuchi |
| 2006/0114954 A1 | 6/2006 | Wong et al. |
| 2006/0125557 A1 | 6/2006 | Manstretta |
| 2006/0192899 A1 | 8/2006 | Ogita |
| 2006/0239308 A1 | 10/2006 | Husain |
| 2006/0261893 A1 | 11/2006 | Chiang et al. |
| 2006/0278813 A1 | 12/2006 | Iesaka |
| 2006/0280211 A1 | 12/2006 | Garez |
| 2007/0047602 A1 | 3/2007 | Tanaka |
| 2007/0058089 A1 | 3/2007 | Wang |
| 2007/0081130 A1 | 4/2007 | May et al. |
| 2007/0098026 A1 | 5/2007 | Uesaka et al. |
| 2007/0159434 A1 | 7/2007 | Yen et al. |
| 2007/0195208 A1 | 8/2007 | Miyazawa et al. |
| 2007/0229718 A1 | 10/2007 | Hall |
| 2007/0263685 A1 | 11/2007 | Takasou |
| 2007/0286609 A1 | 12/2007 | Ikram et al. |
| 2008/0012508 A1 | 1/2008 | Steele et al. |
| 2008/0024469 A1 | 1/2008 | Damera-Venkata et al. |
| 2008/0055005 A1 | 3/2008 | Nam et al. |
| 2008/0074562 A1 | 3/2008 | Endo et al. |
| 2008/0231209 A1 | 9/2008 | Shiwaya et al. |
| 2008/0246893 A1 | 10/2008 | Boss et al. |
| 2008/0303499 A1 | 12/2008 | Chen et al. |
| 2008/0309407 A1 | 12/2008 | Nakamura et al. |
| 2009/0110409 A1 | 4/2009 | Zou et al. |
| 2009/0148094 A1 | 6/2009 | Kucharski et al. |
| 2009/0238226 A1 | 9/2009 | Moto |
| 2010/0164396 A1 | 7/2010 | Lindeberg et al. |
| 2010/0172384 A1 | 7/2010 | Groepl |
| 2010/0183318 A1 | 7/2010 | Tanaka |
| 2011/0062874 A1 | 3/2011 | Knapp |
| 2014/0023374 A1 | 1/2014 | Yuda |
| 2014/0063593 A1 | 3/2014 | Berendt |
| 2014/0226147 A1 | 8/2014 | Metzler |
| 2014/0233594 A1 | 8/2014 | Kubo |
| 2014/0320212 A1 | 10/2014 | Kalantari et al. |
| 2015/0263625 A1 | 9/2015 | Kanezawa |
| 2016/0070123 A1 | 3/2016 | Tatsumi |
| 2016/0072462 A1 | 3/2016 | Itabashi et al. |
| 2016/0134081 A1 | 5/2016 | Louderback |
| 2017/0085057 A1 | 3/2017 | Barnes |

FOREIGN PATENT DOCUMENTS

| | | |
|---|---|---|
| JP | 5-152660 | 6/1993 |
| JP | 2004-045989 | 2/2004 |
| JP | 2001-119250 | 4/2015 |
| WO | WO 93/21706 | 10/1993 |
| WO | WO 02/063800 | 8/2002 |
| WO | WO 2004/098100 | 11/2004 |

OTHER PUBLICATIONS

"PLL Design", http://members.innet.net.au/☐richardh/PPH.htm, 9 pages.

Garth Nash, "AN535 Application Notes—Phase-Locked Loop Design Fundamentals", Motorola, Inc., 1994, 3 pages.

A Low Noise, Wide Dynamic Range, Transimpedance Amplifier with Automatic Gain Control for SDH/SONET (STM16/0C48) in a 30GHz ft BiCMOS Process, Mihai A. T., Sanduleanu, Philips Research Eindhoven, Paul Manteman, Philips Semiconductors Nijmegen, date unknown.

Analog Devices, Background information about wireless communications. http://rf.rfglobalnet.com/library/applicationnotes/files/7/bginfo.htm, Date unknown.

"LCT3454-1A Synchronous Buck-Boost High Current LED Driver" Linear Technology, http://www.linear.com/product/LTC3454 @Linear Technology, 12 pages.

Jamie Bailey "How DVD Works", http://sweb.uky.edu/~jrbai101/dvd.htm, May 1, 1999, pages.

Tuan "Solace" Nguyen, "CD, CD-R, CD-RW, DVD, DD-RAM, DVD-RW, and MO", Tweak3D.Net-Your Freakin' Tweakin Source!, http://www.tweak3d.net/articles/opticals/, May 13, 2000, 7 pages.

"An Introduction to DVD-RW", DVD White Paper, Pioneer New Media Technologies, Inc., Feb. 8, 2001, 8 pages.

Ron Bertrand, "The Basics of PLL Frequency Synthesis", Online Radio & Electronics Course, Apr. 2002, 9 pages.

Richard Wilkinson "Topic: Selecting the Right DVD Mastering Technique", DVD Technology Update, http://www.optical-disc.com/dvdupdate.html, 2002, 8 pages.

Dr. John Rilum, "Mastering Beyond DVD Density", http://www.optical-disc.com/beyonddvd.html, 2002, 7 pages.

"CD Basics: The Bumps", Howstuffworks "How CD Burners Work", http://entertainment.howstuffworks.com/cd-burner1.htm, 2004, 3 pages.

Keith Szolusha, "Linear Technology Design Notes DC/DC Converter Drives Lumileds White LEDs from a Variety of Power Sources—Design Note 340", Linear Technology Corporation, © Linear Technology Corporation 2004, date unknown, 2 pages.

"An Introduction to DVD Recordable (DVD-R) What is DVD Recordable?" http://www.dvd-copy.com/reference/dvd_recordable.html, 2004, 8 pages.

"Power Management, LED-driver considerations" Analog and Mixed-Signal Products, Analog Applications Journal, www.ti.com/sc/analogapps, Texas Instruments Incorporated, © 2005 Texas Instruments Incorporated, Michael Day, 5 pages.

"Linear Technology LCT 3533 2A Wide Input Voltage Synchronous Buck-Boost DC/DC Converter", © Linear Technology Corporation 2007, 16 pages.

"National Semiconductor LM 3549 High Power Sequential LED Driver", © 2010 National Semiconductor Corporation, www.national.com, Aug. 3, 2010, 20 pages.

"TPS63020 TPS63021 High Efficiency Single Inductor Buck-Boost Converter With 4-A Switches", Texas Instruments, Copyright © 2010, Texas Instruments Incorporated, Apr. 2010, 28 pages.

"LT3476-High Current Quad Output LED Driver" Linear Technology, http://www.linear.com/product/LT3476, @2010 Linear Technology, 14 pages.

"Current mirror" Wikipedia, the free encyclopedia, http://en.wikipedia.org/wiki/Current_mirror, May 22, 2011, 8 pages.

"Mosfet" Wikipedia, the free encyclopedia, http://en.wikipedia.org/wiki/MOSFET, May 22, 2011, 24 pages.

Kim, "Dual Output Transimpedance Amplifier of Cost Effective CMOS Optical Receiver for Digital Audio Interfaces" Circuits and Systems, 2007. ISCAS 2007. IEEE International Symposyum.

P.M. Crespo Bofil, G. Shing Liu, C. Ho Wei. Combine baud-rate timing recovery and adaptive equalization for high rate data transmission in digital subscriber lines. In Comunicaciones de Telefonica

(56) References Cited

OTHER PUBLICATIONS y Desarrollo, vol. 41, No. 7, Jun. 1993. http://www.tid.es/presencia/publicaciones/comsid/esp/articulos/vol41/combi/combi.html.

* cited by examiner

FIG. 6

| I2_ctrl[2:0] register | VOUT(V) | Vheadroom (V) | Delta Vheadroom (V) |
|---|---|---|---|
| 1 | 2.719 | 0.907 |  |
| 2 | 2.842 | 1.009 | 0.102 |
| 3 | 2.946 | 1.106 | 0.097 |
| 4 | 3.054 | 1.211 | 0.105 |
| 5 | 3.155 | 1.308 | 0.097 |
| 6 | 3.259 | 1.409 | 0.101 |
| 7 | 3.36 | 1.507 | 0.098 |

FIG. 7

| Reql=11Ohm I1_ctrl[2:0]/Imod | VOUT(V) | Vheadroom (V) | Delta Vheadroom (V) |
|---|---|---|---|
| 0mA | 2.554 | 0.808 |  |
| 3.5uA/3.5mA | 2.626 | 0.845 | 0.037 |
| 7uA/7mA | 2.683 | 0.884 | 0.039 |
| 14uA/14mA | 2.781 | 0.959 | 0.075 |
| 28uA/28mA | 2.946 | 1.109 | 0.15 |
| 56uA/56mA | 3.261 | 1.408 | 0.299 |

EFFICIENCY IMPROVED DRIVER FOR LASER DIODE IN OPTICAL COMMUNICATION

PRIORITY CLAIM

This application is a continuation of and claims priority to co-pending PCT Patent Application No. PCT/US2018/054257 filed on Oct. 4, 2018, titled Efficiency Improved Driver For Laser Diode in Optical Communication, which claims priority to and the benefit of U.S. Provisional Patent Application No. 62/568,248 filed on Oct. 4, 2017. This application also claims priority to and the benefit of U.S. Provisional Patent Application No. 62/568,248 filed on Oct. 4, 2017, the contents of which are incorporated by reference in its entirety herein.

FIELD OF THE INVENTION

The present invention relates to laser diodes and to methods of driving laser diodes.

BACKGROUND OF THE INVENTION

Laser diodes have found increasing usage as optical transmitters in fiber optic communications systems. In such systems, the laser diode is typically driven by a constant current from an on-chip laser driver. In some optical transmission systems, an external DC to DC converter may be used to provide a fixed supply voltage for the laser diode from a main input voltage. However, this solution is not ideal. For example, a fixed DC converter output does not compensate for the burn-in characteristics or temperature drift of the laser diode over time. Additionally, if the laser diode is operating at high frequencies, the modulation current in the laser driver can change at high speeds and the DC converter will not be able to adjust the supply voltage to provide sufficient headroom voltage for the laser diode as more or less modulation current flows into the laser and the voltage drop across it changes accordingly.

The power dissipated on or in the laser driver may be calculated as the constant current multiplied by the headroom across it. Unfortunately, the headroom voltage is not optimized in a typical system, which wastes power. It would improve the whole system efficiency if an optimized and continuously updated headroom voltage for the laser diode could be determined and applied. Besides the advantage of efficiency, an optimized and continuously updated headroom voltage would also automatically compensate for the I-V curve drift over the lifetime of the laser diode and changes due to temperature variations to keep the bias current constant.

SUMMARY

Aspects of embodiments of the invention include a circuit and method that provide a headroom voltage for a laser diode driver driving the laser diode providing signals to an optical communications device. The circuit includes a headroom control circuit receiving the headroom voltage from the laser driver, the headroom control circuit generating a controlled voltage Vc based on the headroom voltage and a modulation current of the laser driver, and a DC-DC converter receiving the controlled voltage from the headroom control circuit and generating a voltage Vout based on the controlled voltage, and applying the voltage Vout as a supply to the laser diode. The headroom control circuit and the DC-DC converter are connected in a feedback loop with the laser diode to continuously provide the voltage Vout to the laser diode, and the headroom control circuit controls the voltage Vc to compensate for high frequency reflections in the laser driver due to high frequency modulation current to maintain an optimized headroom voltage for the laser driver.

In further aspects of embodiments of the invention, the DC-DC converter is configured to generate a control voltage based on the input of the headroom control circuit, and to generate driver signals to modify the voltage Vout based on a value of the input. The DC-DC converter may compare the control voltage to a saw-tooth waveform to generate the driver signals to modify the voltage Vout based on a value of the input. Other DC-DC converter implementations and/or control scheme can be implemented. In one embodiment, the DC-DC converter includes a plurality of switches that are controlled by the driver signals to modify the voltage Vout as needed.

It is also contemplated that the headroom control circuit includes at least one programmable current source and/or at least one programmable resistor. In further aspects of embodiments of the invention, a value that the at least one programmable current source and/or the at least one programmable resistor are set to control the headroom voltage of the laser driver. In one variation, a change of the value that the at least one programmable current source and/or the at least one programmable resistor are set to controls the headroom voltage of the laser driver and controls the voltage Vout supply to the laser diode.

In further aspects of embodiments of the invention, a circuit provides a headroom voltage for a laser driver driving a laser diode, the laser diode configured to provide signals to an optical communications device. The circuit comprises a feedback loop circuit connected between the output of the laser diode and an input of the laser driver such that the feedback loop is configured to generate a voltage Vout based on the headroom voltage and to apply the voltage Vout to the input of the laser diode. The feedback loop circuit is configured to generate Vout to compensate for burn-in characteristics and/or temperature drift of the laser diode over time to maintain an optimized headroom voltage for the laser driver.

Also contemplated for the circuit such that the feedback loop circuit comprises a headroom control circuit having an input connected to receive the headroom voltage from the output of the laser driver. The headroom control circuit is configured to generate a controlled voltage based on the headroom voltage. And, a DC-DC converter configured to convert the controlled voltage to the voltage Vout such that the voltage Vout is applied to the input of the laser diode. In one embodiment, the DC-DC converter is configured to generate a control voltage based on the controlled voltage from the headroom control circuit and to generate driver signals to modify the voltage Vout based on a value of the control voltage. The DC-DC converter may compare the control voltage to a saw-tooth waveform to generate the driver signals to modify the voltage Vout based on a value of the control voltage.

In one embodiment, the DC-DC converter includes a plurality of switches that are controlled by the driver signals to modify the voltage Vout as needed. The headroom control circuit may include at least one programmable current source and/or at least one programmable resistor. In one variation, a value that the at least one programmable current source and/or the at least one programmable resistor are set to control the headroom voltage of the laser driver. A change of the value that the at least one programmable current source and/or the at least one programmable resistor are set to may control the headroom voltage of the laser driver and controls the voltage Vout input to the laser diode.

Also disclosed is a method of controlling a headroom voltage of a laser driver with the laser diode being driven by the laser driver and a headroom control circuit connected to receive the headroom voltage of the laser driver while a DC-DC converter connects to receive an output out the headroom control circuit and to output a voltage Vout to an input of the laser diode. This method comprises generating a controlled voltage based on the headroom voltage with the headroom control circuit and generating a voltage Vout based on the controlled voltage with the DC-DC converter, and then applying the voltage Vout as an input to the laser diode, such that the DC-DC converter modifies the voltage Vout to compensate for burn-in characteristics or temperature drift of the laser diode over time to maintain an optimized headroom voltage for the laser driver.

In one embodiment, the method further comprising generating a control voltage based on the controlled voltage from the headroom control circuit and generating driver signals to modify the voltage Vout based on a value of the control voltage. The method may further comprise comparing the control voltage to a saw-tooth waveform to generate the driver signals to modify the voltage Vout. In one configuration the method further comprises controlling a plurality of switches in the DC-DC converter to modify the voltage Vout. This method may also set a value of at least one programmable current source and/or at least one programmable resistor in the headroom control circuit to set the headroom voltage to a desired value.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 6 illustrates test results of different Vout, Vheadroom and Delta Vheadroom values obtained when varying the programmable current source I2.

FIG. 7 illustrates test results of different Vout, Vheadroom and Delta Vheadroom values obtained when varying the programmable current source I1.

DETAILED DESCRIPTION OF PREFERRED EMBODIMENTS

In the following description, numerous specific details are set forth in order to provide a more thorough description of embodiments of the present invention. It will be apparent, however, to one skilled in the art, that the embodiments of the present invention may be practiced without these specific details. In other instances, well-known features have not been described in detail so as not to obscure the embodiments of the present invention.

Figure 1:
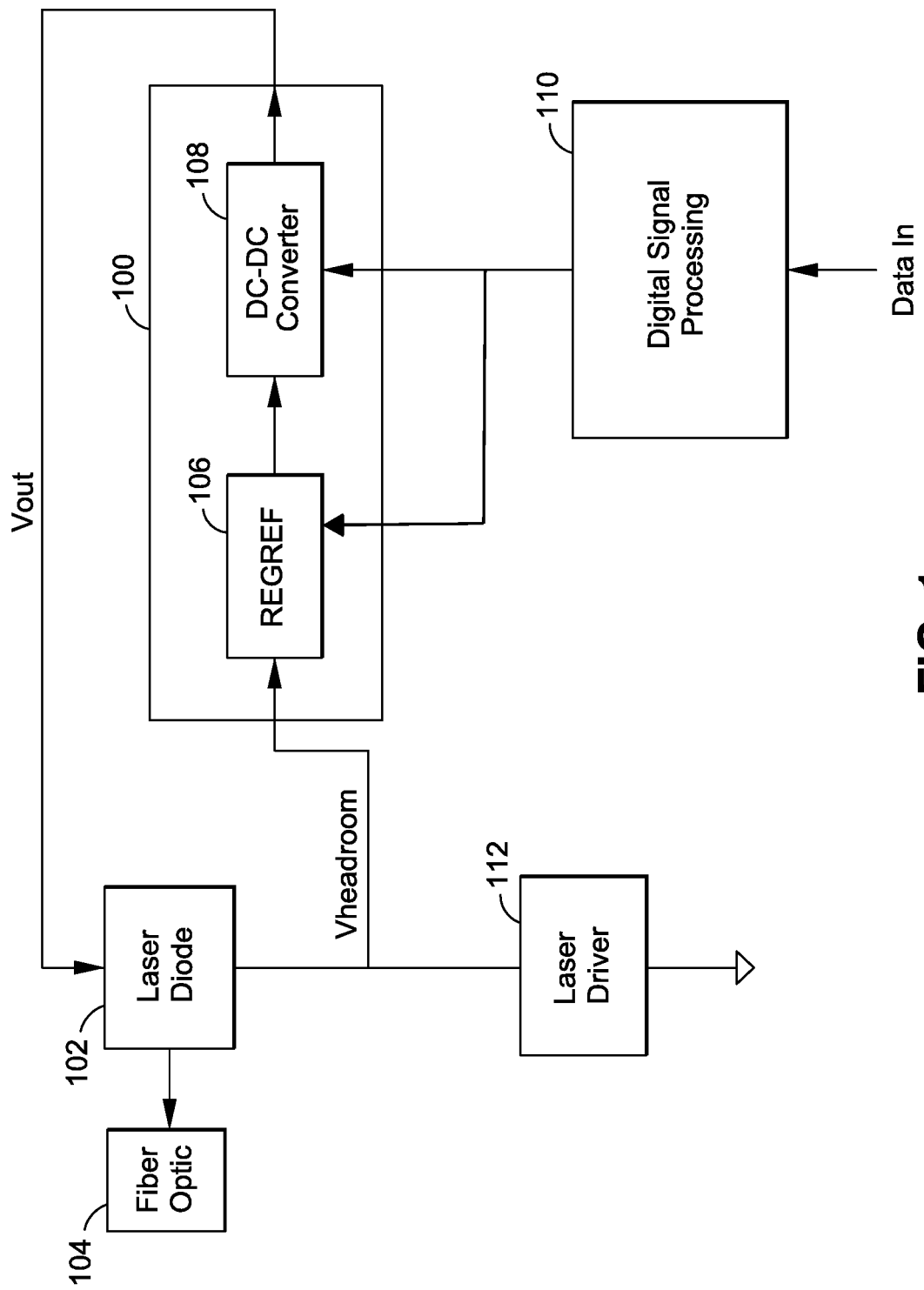
FIG. 1 illustrates a block diagram of a circuit for providing a voltage for a laser diode, the laser diode providing signals to fiber optics, in accordance with embodiments of the present invention.

FIG. 1 illustrates a block diagram of a circuit 100 for providing an optimized headroom to a laser diode 102. The laser diode 102 of FIG. 1 may be used to provide signals in optical communications, such as providing signals to optical fiber 104, for example of for free space communications. However, other uses of the laser diode 102 may also be utilized with preferred embodiments of the invention.

Headroom is defined herein as the difference between the supply voltage and the sum of the individual voltage drops along a single circuit path. The headroom for a laser driver as shown in FIG. 1 would be the voltage applied to the laser diode (Vout) minus the drop across the laser diode and any circuitry associated with the driver disposed between the laser diode 102 and Vout. A laser driver such as npn transistors 304 and 305 shown in FIG. 3 typically may need about 0.7V of headroom.

If the voltage at the laser diode input (Vout) were 3.3 volts (as defined for VccT by the SFP+ High Speed Electrical Interface Standard SFF-8431), then the headroom for the laser driver may be insufficient due to the above-described voltage drop increase. Accordingly, embodiments of the present invention continuously adjust the voltage Vout to provide an optimized headroom for the laser driver.

Additionally, the laser driver 212 is operated at high frequency in turning on and off the laser diode 102 by sending pulses of current into the laser diode 102, 202, typically using a square wave signal having a very sharp edge. In turning on and off the laser, the current in the circuit is sent through the laser diode 202 (when the laser diode is turned on) or through the branch of the circuit of FIG. 3 including the bipolar transistors 304 (when the laser diode is turned off).

However, because of the high frequency effects, when the square pulse is applied, in the beginning only the characteristic impedance of the load is applied (for example 25 Ohms in the case of DML lasers) because the signal has not yet traveled along the transmission line, but when the signal travels along the transmission line and is reflected back, an additional peak of voltage is present which is typically equal to the modulation current I mod times the resistance equivalent of the laser Reql. The Reql of a laser is a quantity that depends on the physical dimensions and manufacturing characteristics of the laser and optical subassembly construction (bond wires leading to the laser, flex-cables connecting the laser driver board to the laser, etc.). This peak voltage is typically about 1V. After the edge of the square wave has passed, now a continuous mode type of condition of is present and current is flowing into the laser diode, and the drop across the laser diode 202 is equal to the diode voltage of the laser plus the dc resistance of the laser times the current. The dc resistance of the laser diode is smaller than the Reql of the laser diode (the high frequency resistance of the laser diode). To make the driver not be compressed during the transition between turning off and on of the laser diode, a higher voltage needs to be applied than during purely DC operation due to the additional peak voltage.

Figure 3:
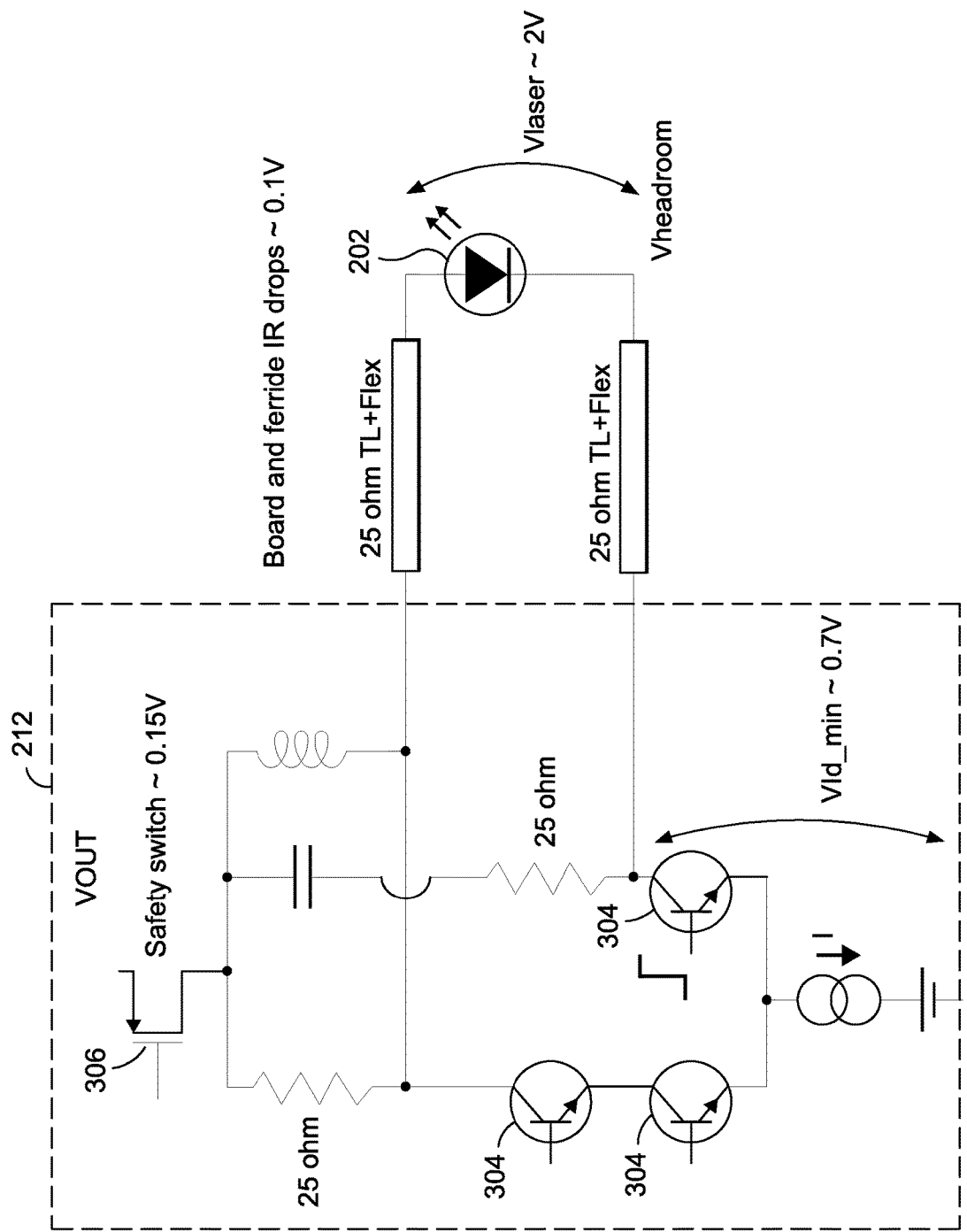
FIG. 3 illustrates a schematic diagram of a laser diode driver and associated circuitry for providing high speed current signals with optimized headroom to drive a laser diode in accordance with embodiments of the present invention.

As shown in FIG. 3 illustrating the laser driver 212 in further detail, in typical DML applications, Vout must be about 4V or greater to provide sufficient headroom to the n-p-n transistors 304, 305 of the laser driver considering the associated voltage drops across the laser diode 202 and the circuitry associated with the laser driver 212 when considering the high frequency effects. For an extreme example, the safety switch 306 may have a voltage drop of ~0.15V, the board and ferride voltage drops may be ~0.1V, the voltage drop across the laser diode 202 may be ~2.0V and as explained above, the peak voltage may be about 1.0V reflected back from the transmission line. Thus, to provide the needed headroom voltage of ~0.7V, Vout should be ~0.15V+0.1V+2.0V+0.7V+1.0V, or around 4.0V. This would prove problematic using a module with a 3.3V supply. Accordingly, embodiments of the present invention can provide a Vout of approximately 4.0V or greater for worst case conditions.

The circuit 100 of FIG. 1 for providing an optimized headroom to the laser diode 102 includes a REGREF 106 and a DC-DC converter 108. The REGREF 106 is a headroom control circuit that provides a controlled voltage to the DC-DC converter 108. The DC-DC converter 108 is configured to convert the voltage provided by the REGREF 106 to a voltage Vout, which is used as an input to the laser diode 102. The digital signal processing 110 will monitor the performance of the laser diode and processes to send appropriate signals to the DC-DC converter 108, for modulation of the output voltage Vout, so that data can be provided to the fiber optic 104 with a low error rate.

The REGREF 106 receives as digital command from digital signal processing 110 and an input a voltage Vheadroom from the output of the laser driver 112, which may be used in a feedback loop to adjust the voltage Vout applied as an input to laser diode 102. The headroom voltage of the laser driver may be adjusted by the REGREF 106 to provide a desired headroom voltage and to automatically compensate for changes in the modulation current.

The laser driver 112, 212 modulates the current in the laser diode 102 to transmit the optical signal at 28 Gbps, although other speeds could be used. The average current required by the laser diode 102, 202 changes as a function of temperature as well as aging effects. The voltage drop across the laser diode 102 will change accordingly. The DC-DC converter 108 account for or react to the very high frequency reflections created by the mismatch impedance of the laser driver 112 with respect to the laser diode 102. This reflection depends on the impedances at play in the system (in particular laser bonding inductances) and is fairly constant for a given system. This is referred to herein as equivalent laser resistance or Reql. These reflections are also proportional to the modulation current (Imod).

The laser driver 112 may be a DML (direct modulated laser) driver. To guarantee the DML driver performance, the headroom should be:

$$V\text{headroom} = Vld\_min + Imod * Reql \quad (1)$$

where Vld_min is the minimum dc voltage at the output of the laser driver to guarantee performance (this is usually determined by the design and is in the order of 0.7V), Reql is the equivalent impedance of the laser diode 102, 202 which is proportional to the reflection from the transmission line, and Imod is the modulation current in the laser diode 102. As explained above Reql*Imod is typically about 1.0V.

The power dissipation in the laser driver 112 can be calculated as in equation (2) below. Equation (2) shows that the power dissipation (Pdiss) equals the headroom voltage (Vheadroom) times the average modulation current (Iave). If the headroom voltage is too low, the laser driver performance will suffer and error rate will increase. If the headroom voltage is too high, not only will the power dissipation be suboptimal, but also there is a risk of breakdown for the high frequency bipolar transistors 304 used in the laser driver 112.

$$Pdiss = V\text{headroom} * Iave \quad (2)$$

Figure 2:
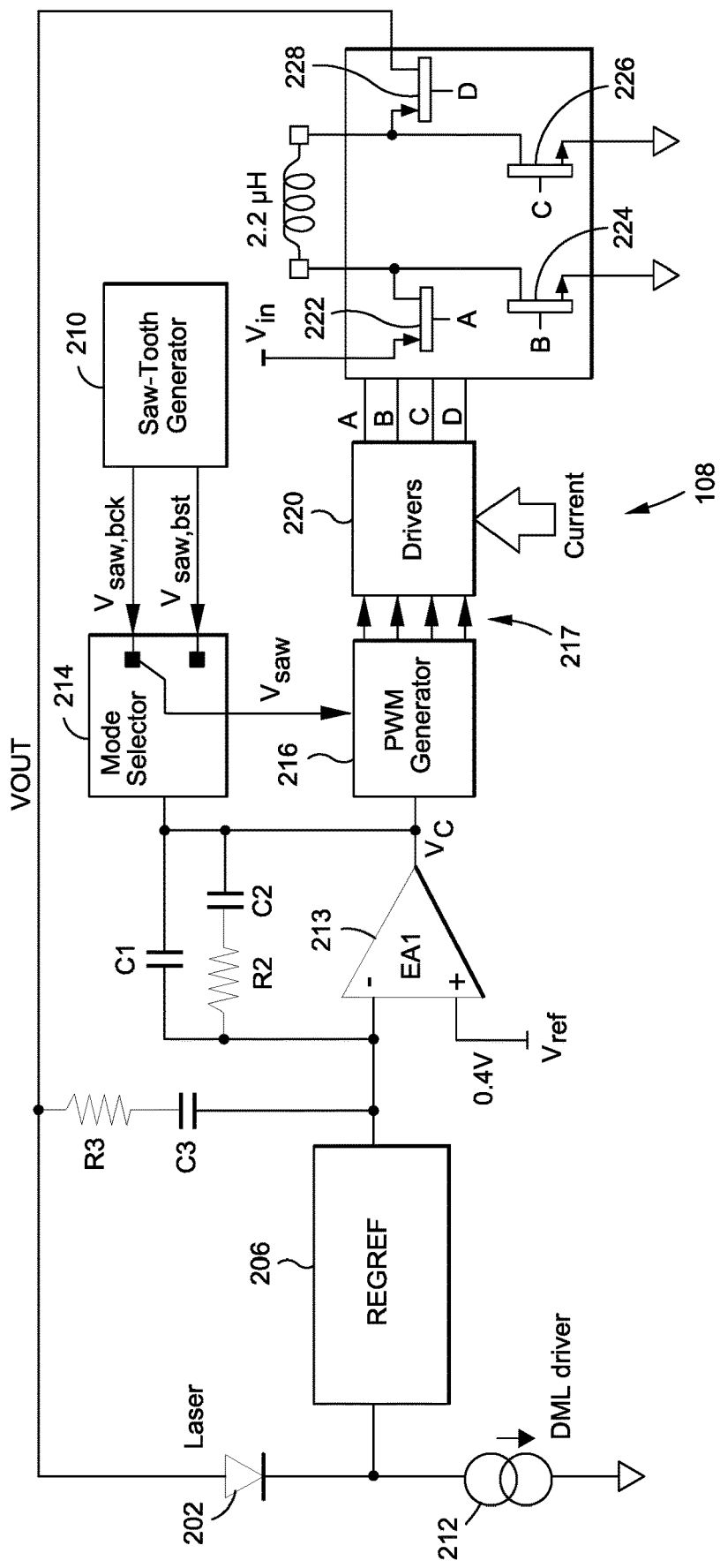
FIG. 2 illustrates a DC-to-DC converter for providing a voltage to the laser diode in accordance with embodiments of the present invention.

Further details of the DC-DC converter 108 and its connection to the REGREF 206, laser diode 202 and laser driver 212 are illustrated in FIG. 2. The DC-DC converter 108 outputs voltage Vout to the laser diode 202, which is driven by the laser driver 212. The REGREF 206 adjusts the voltage received at its input to output a voltage to error amplifier EA1 213, with a voltage of 0.4V applied at the positive input of EA1 213 to produce control voltage Vc.

The saw-tooth generator 218 generates saw tooth waveforms Vsaw.bck and Vsaw.bst, which are selected under the control of mode selector 214 to output saw-tooth waveform Vsaw. The saw-tooth waveforms may be 2.5 Mhz saw-tooth waveforms, although other waveforms could be used. The saw-tooth waveform is compared with Vc in the PWM generator 216 to generate the PWM modulated signals 217 used by drivers 220 to generate the PWM modulated signals A, B, C and D, which are used to control the transistors 222, 224, 226 and 228 to produce the desired Vout. Appropriate control of the transistors 222, 224, 226 and 228 is used to raise or lower Vout as needed, such that a Vout can be provided between approximately 2.0V and 4.5V.

The REGREF 106, 206 will adjust the headroom voltage to automatically compensate for the I-V curve drift over the lifetime of the laser diode 202 and compensate for changes in temperature to keep the bias current constant. For example, if the voltage drop across the laser diode 202 were to change due to a change in temperature or due to drift over time, the voltage at the output of the laser driver (Vheadroom) would change and could become too low or too high to provide a headroom with optimal performance. For example, if the voltage Vheadroom was reduced due to a change in temperature and a bigger voltage drop across the laser diode 202, the voltage at the output of REGREF 206 and input to error amplifier EA1 213 would be lowered, resulting in a changed control voltage Vc. The changed control voltage Vc, would result in a changed Vout being applied to the laser diode 202.

Figure 4:
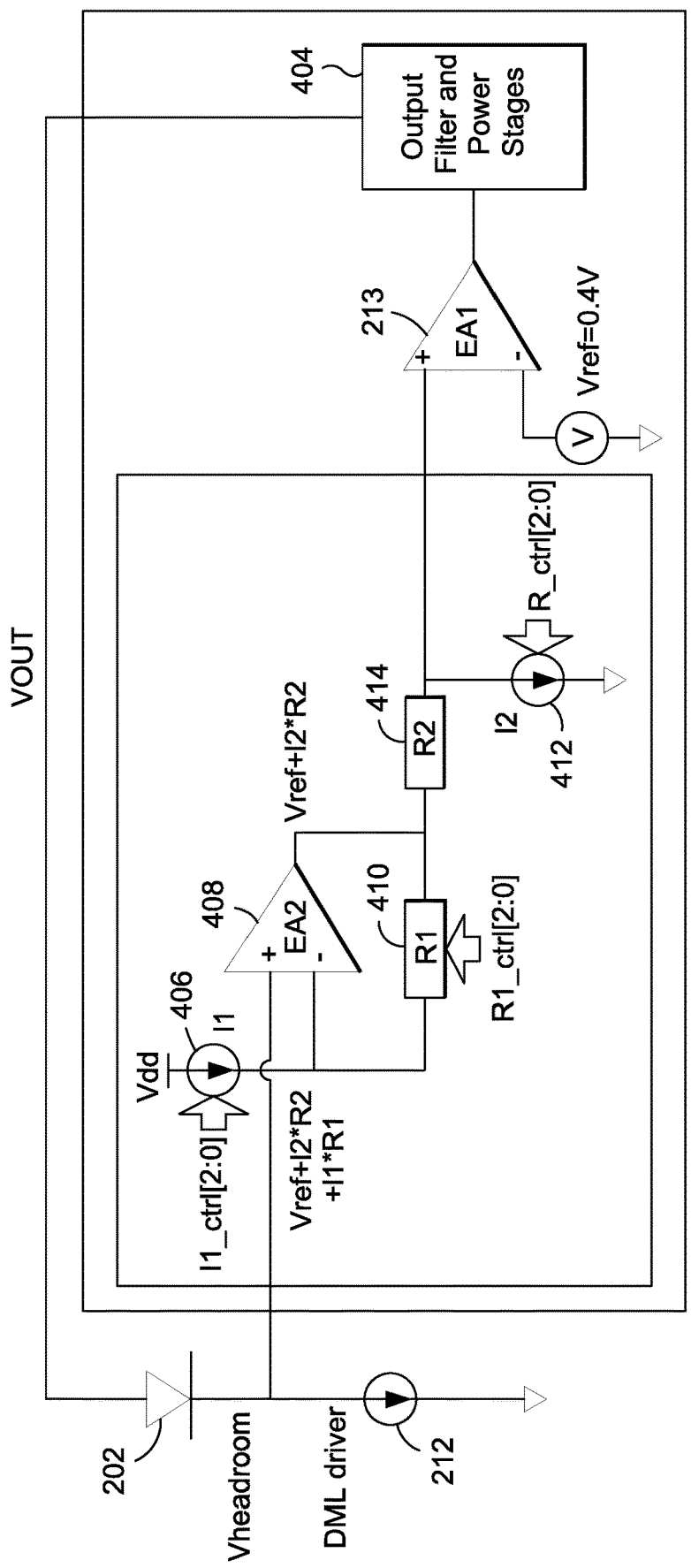
FIG. 4 illustrates a schematic diagram of the headroom control circuit (REGREF) and associated circuitry of FIG. 3, with the associated circuitry shown in detail, in accordance with embodiments of the present invention.

The REGREF 206 is shown in further detail in FIG. 4, along with its connection to the laser diode 202, laser driver 212 and DC-DC converter. The REGREF 206 includes an error amplifier EA2 and a set of programmable resistors R1 410 and R2 414 and programmable current sources I1 406 and I2 412. The headroom voltage Vheadroom at the laser driver 212 is input to the positive input of the error amplifier EA2, and a voltage generated at the output of I1 406 (I1*R1) is input to the negative input of the error amplifier EA1 213. The voltage at the output of the error amplifier EA2 408 is Vref+I2*R2. When the feedback loop is closed through the DC-DC converter, the voltage Vout will self-adjust in such a way that equation (3) is satisfied:

$$V\text{headroom} = Vref + R2*I2 + R1*I1 \quad (3)$$

I1 is used to generate a voltage (I1*R1) which when added to R2*I2 and Vref at EA1 creates the minimum voltage required by the laser driver for operation Vld_min as shown in equation (4) where I1 and R1 are held constant. This minimum voltage for laser driver operation is typically about 0.7V.

$$Vld\_min = R2*I2 + Vref \quad (4)$$

$$Imod*Reql + I1*R1 \quad (5)$$

Importantly, I1 is configured to track the changes in the modulation current of the laser driver 212. This could be accomplished in many ways, such as using a monitoring circuit to monitor changes in the modulation current of the laser driver 212 with the monitoring circuit configured to make corresponding or proportional changes in the programmable current source I1 406.

In closed loop operation, the REGREF 106, 206 will adjust Vc and thus Vout to ensure that equation (3) is valid regardless of the laser diode operation voltage (which may change with temperature/aging) and other IR drops due to board/ferride resistance and the voltage drop of the safety switch (See FIG. 3).

Figure 5:
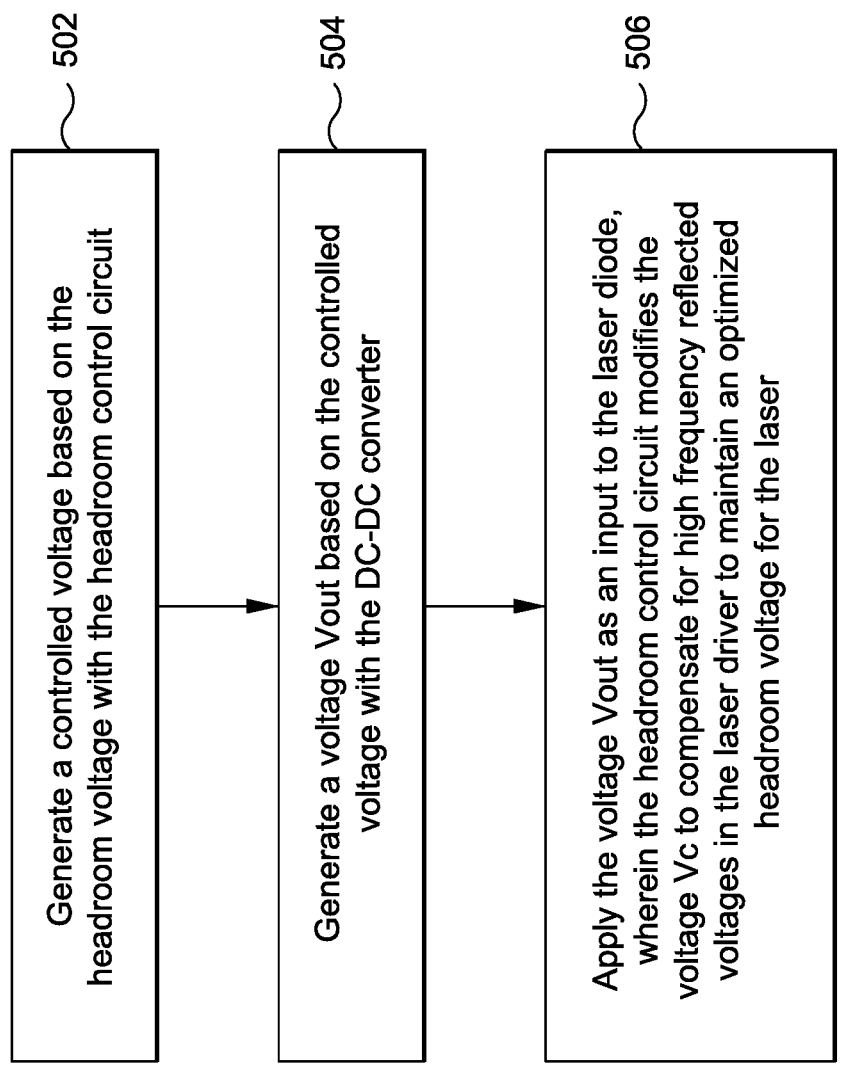
FIG. 5 illustrates a flowchart in accordance with embodiments of the present invention.

FIG. 5 illustrates a flowchart according to embodiments of the invention. In step 502, the headroom control circuit REGREF generates a controlled voltage based on the headroom voltage Vheadroom. In step 504, the DC-DC converter generates a voltage Vout based on the controlled voltage received from the headroom control circuit.

In step 506, the voltage Vout is applied as an input to the laser diode, wherein the DC-DC converter modifies the voltage Vout to compensate for burn-in characteristics or temperature drift of the laser diode over time to maintain an optimized headroom voltage for the laser driver.

FIG. 6 illustrates test results of the headroom control circuit REGREF 206 with changes in a control bit I2_ctrl [2:0] that changes the current injected at programmable current source I2 412 with R1, I1 and R2 held constant. As shown in FIG. 6, each step will change the Vout and Vheadroom by about 100 mV. This allows a user of the embodiments of the invention to set a desired headroom Vheadroom by adjusting the programmable current source I2 412. Different currents may be used to produce higher or lower headroom Vheadroom as desired.

FIG. 7 illustrates test results of the headroom control circuit REGREF 206 with changes in an injected current applied at programmable current source I1 406. This test set R1 to 11K Ohms and changes the value of I1 with I2 and R2 held constant. For every 3.5 A change in I1, the headroom voltage Vheadroom changes by about 38 mV. This allows a user of the embodiments of the invention to set a desired headroom Vheadroom by adjusting the programmable current source I1 406. Different currents may be used to produce higher or lower headroom Vheadroom as desired.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A circuit for providing a voltage Vout with an optimized headroom voltage to a laser diode driven by a laser driver, the laser diode configured to provide signals to an optical communications device, comprising:

a headroom control circuit having an input connected to receive the headroom voltage from a connection between the laser diode and the laser driver, the headroom control circuit configured to generate a controlled voltage Vc based on the headroom voltage and a modulation current of the laser driver; and a DC-DC converter connected to receive the controlled voltage Vc from the headroom control circuit and to generate the voltage Vout based on the controlled voltage Vc, and to apply the voltage Vout as an input to the laser diode, wherein the headroom control circuit and the DC-DC converter are connected in a feedback loop with the laser diode to continuously provide the voltage Vout to the laser diode, and the headroom control circuit controls the voltage Vc to compensate for high frequency reflections in the laser driver to maintain an optimized headroom voltage for the laser driver.

2. The circuit in accordance with claim 1, wherein the DC-DC converter is configured to generate a control voltage based on the controlled voltage from the headroom control circuit, and to generate driver signals to modify the voltage Vout based on a value of the control voltage.

3. The circuit in accordance with claim 2, wherein the DC-DC converter compares the control voltage to a sawtooth waveform to generate the driver signals to modify the voltage Vout based on a value of the control voltage.

4. The circuit in accordance with claim 1, wherein the DC-DC converter includes a plurality of switches that are controlled by the driver signals to modify the voltage Vout as needed.

5. The circuit in accordance with claim 1, wherein the headroom control circuit includes at least one programmable current source and/or at least one programmable resistor.

6. The circuit in accordance with claim 5, wherein a value that the at least one programmable current source and/or the at least one programmable resistor are set to control the headroom voltage of the laser driver.

7. The circuit in accordance with claim 6, wherein a change of the value that the at least one programmable current source and/or the at least one programmable resistor are set to controls the headroom voltage of the laser driver and controls the voltage Vout input to the laser diode.

8. A circuit for providing a headroom voltage for a laser driver driving a laser diode, the laser diode configured to provide signals to an optical communications device, comprising:

a feedback loop circuit connected between the output of the laser diode and an input of the laser driver, the feedback loop configured to generate a voltage Vout based on the headroom voltage and to apply the voltage Vout to the input of the laser diode, wherein the feedback loop circuit is configured to generate Vout to compensate for high frequency reflections in the laser driver to maintain an optimized headroom voltage for the laser driver.

9. The circuit in accordance with claim 8, wherein the feedback loop circuit comprises:

a headroom control circuit having an input connected to receive the headroom voltage from the output of the laser driver, the headroom control circuit configured to generate a controlled voltage based on the headroom voltage; and a DC-DC converter configured to convert the controlled voltage to the voltage Vout, the voltage Vout applied to the input of the laser diode.

10. The circuit in accordance with claim 9, wherein the DC-DC converter is configured to generate a control voltage based on the controlled voltage from the headroom control circuit, and to generate driver signals to modify the voltage Vout based on a value of the control voltage.

11. The circuit in accordance with claim 10, wherein the DC-DC converter compares the control voltage to a saw-tooth waveform to generate the driver signals to modify the voltage Vout based on a value of the control voltage.

12. The circuit in accordance with claim 8, wherein the DC-DC converter includes a plurality of switches that are controlled by the driver signals to modify the voltage Vout as needed.

13. The circuit in accordance with claim 8, wherein the headroom control circuit includes at least one programmable current source and/or at least one programmable resistor and an error and an error amplifier.

14. The circuit in accordance with claim 13, a value that the at least one programmable current source and/or the at least one programmable resistor are set to control the headroom voltage of the laser driver.

15. The circuit in accordance with claim 14, wherein a change of the value that the at least one programmable current source and/or the at least one programmable resistor are set to controls the headroom voltage of the laser driver and controls the voltage Vout input to the laser diode.

16. A method of controlling a headroom voltage of a laser driver, the laser diode being driven by a laser driver, a headroom control circuit connected to receive the headroom voltage of the laser driver, a DC-DC converter connected to receive an output out the headroom control circuit and to output a voltage Vout to an input of the laser diode, the method comprising:
 generating a controlled voltage based on the headroom voltage with the headroom control circuit; and
 generating a voltage Vout based on the controlled voltage with the DC-DC converter, and applying the voltage Vout as an input to the laser diode, wherein the headroom control circuit modifies the voltage Vout to compensate for high frequency reflections in the laser driver to maintain an optimized headroom voltage for the laser driver.

17. The method of claim 16, further comprising generating a control voltage based on the controlled voltage from the headroom control circuit, and generating driver signals to modify the voltage Vout based on a value of the control voltage.

18. The method of claim 17, further comprising comparing the control voltage to a saw-tooth waveform to generate the driver signals to modify the voltage Vout.

19. The method of claim 18, further comprising controlling a plurality of switches in the DC-DC converter to modify the voltage Vout.

20. The method of claim 16, further comprising setting a value of at least one programmable current source and/or at least one programmable resistor in the headroom control circuit to set the headroom voltage to a desired value.

* * * * *